United States Patent
Nikai

(10) Patent No.: US 8,284,277 B2
(45) Date of Patent: Oct. 9, 2012

(54) SOLID-STATE IMAGING DEVICE AND IMAGING APPARATUS

(75) Inventor: Norihiro Nikai, Kanagawa (JP)

(73) Assignee: Sony Corporation, Tokyo (JP)

( * ) Notice: Subject to any disclaimer, the term of this patent is extended or adjusted under 35 U.S.C. 154(b) by 88 days.

(21) Appl. No.: 12/929,248

(22) Filed: Jan. 11, 2011

(65) Prior Publication Data

US 2011/0187910 A1    Aug. 4, 2011

(30) Foreign Application Priority Data

Jan. 29, 2010    (JP) ................................ 2010-019056

(51) Int. Cl.
*H04N 9/64* (2006.01)
(52) U.S. Cl. ........................................ 348/245; 348/243
(58) Field of Classification Search .................. 348/308, 348/281, 241, 243, 245, 246; 382/162, 167; 250/208.1
See application file for complete search history.

(56) References Cited

U.S. PATENT DOCUMENTS

| | | | |
|---|---|---|---|
| 2008/0218615 A1* | 9/2008 | Huang et al. | 348/294 |
| 2011/0032391 A1* | 2/2011 | Cheung | 348/241 |
| 2011/0102624 A1* | 5/2011 | Hashizume | 382/167 |
| 2011/0102649 A1* | 5/2011 | Hashizume | 348/246 |

FOREIGN PATENT DOCUMENTS

JP    2003-222751    8/2003

* cited by examiner

*Primary Examiner* — Aung S Moe
(74) *Attorney, Agent, or Firm* — Rader Fishman & Grauer, PLLC

(57) ABSTRACT

A solid-state imaging device includes: a pixel array section having an effective pixel region formed by a plurality of pixels which are disposed in the form of a matrix, each of which includes a photoelectric conversion device and a transistor reading out an electric charge obtained by photoelectric conversion at the photoelectric conversion device, and which are illuminated by light and a light-shielded pixel region formed by a plurality of pixels which are shielded from light; a row scan section selecting and controlling each row of pixels of the pixel array section to output a signal from each of the pixels of the selected row of pixels to a column signal line provided in association with the row of pixels; and an A-D conversion section converting the signal output from the signal line into a digital signal.

3 Claims, 11 Drawing Sheets

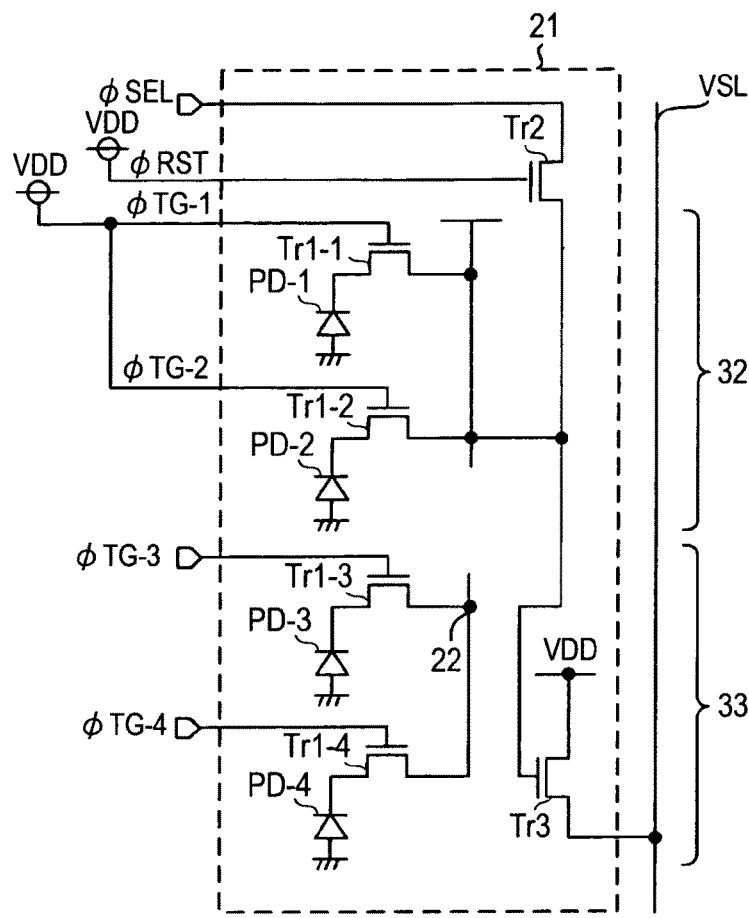

SOLID-STATE IMAGING DEVICE AND IMAGING APPARATUS

BACKGROUND OF THE INVENTION

1. Field of the Invention

The present invention relates to a CMOS type solid-state imaging device and an imaging apparatus having such an element.

2. Description of the Related Art

Recently, imaging apparatus capable of imaging utilizing a solid-state imaging device and capable of storing resultant images have widely spread, such apparatus including digital still cameras and digital video cameras. CCD type solid-state imaging devices have been most commonly used as solid-state imaging devices of such imaging apparatus. However, there is a recent trend toward solid-state imaging devices having a greater number of pixels, as a result of which increasing attention is paid to CMOS type solid-state imaging devices.

A CMOS type solid-state imaging device is a solid-state imaging device which includes a pixel array section constituted by a two-dimensional array of a plurality of pixels each including a photoelectric conversion device and a plurality of pixel transistors or what are called MOS transistors and which read outs electrical signals obtained by converting electrical charges generated by the photoelectric conversion devices. CMOS type solid-state imaging devices are characterized by the capability of readout at a higher speed, higher sensitivity, and lower power consumption when compared to CCD type solid-state imaging devices. A CMOS type solid-state imaging device can be consolidated with analog circuits and logic circuits manufactured using CMOS processes into a single chip, and the resultant chip is therefore advantageous in that it requires a small number of peripheral ICs.

As shown in FIG. 16, a pixel array section 100 of a CMOS type solid-state imaging device has an optical black pixel region 102 provided outside an effective pixel region 101 which is illuminated by light. The region 102 includes pixels which are shielded from the illumination light to obtain an optical black level (hereinafter referred to as "optical black pixels"). The optical black pixels are configured to generate the same dark current as generated at effective pixels, and signals from the effective pixel region 101 are read out using the level of the dark current (black level) as a reference level. Thus, the magnitude of the dark current generated at the effective pixel region 101 is prevented from varying between the pixels therein, whereby the generation of noise having a fixed pattern and the generation of vertical stripes is suppressed. Fluctuations of signal levels at the effective pixel region 101 attributable to temperature changes can be also suppressed.

However, when intense light impinges on pixels of the effective pixel region 101 in the neighborhood of the optical black pixel region 102, the overflow of electrical charges occurs at the pixels of the effective pixel region 101, and electrical charges flow into the optical black pixel region 102 to increase the black level of the region 102, which phenomenon is called blooming. As a result, when outputs from the effective pixel region 101 are read out using the black level as a reference, a blackish dim image or an abnormal image will be generated. That is, an image of low quality will be reproduced.

One proposed solution to the problem is to provide a dummy pixel region in the form of an array of dummy pixels between an effective pixel region and an optical black pixel region (see JP-A-2006-222751 (Patent Document 1)).

SUMMARY OF THE INVENTION

Problems as described below have occurred in CMOS type solid-state imaging devices having a dummy pixel region provided between an effective pixel region and an optical black pixel region.

First, since the dummy pixel region is always kept in an unselected state, when signals are read out from each row of pixels of the pixel array section, driving loads placed on circuits driving various control lines undergo abrupt fluctuations when the position under the row scanning in progress moves from the optical black pixel region into the dummy pixel region. Such abrupt load fluctuations result in fluctuations of the power supply voltage. Thus, noise is generated in signals read out from the effective pixel region, and the reproduced image consequently has low image quality.

Second, in the case of a pixel-shared type element in which a floating diffusion (hereinafter abbreviated as "FD") portion is shared by pixels in the direction in which columns of pixels extend, the total capacity of floating diffusion nodes can vary between the rows of pixels if part of the pixels are used as dummy pixels when viewed in the column direction with the rest of the pixels read out in a normal manner. As a result, there will be variation in the output of the black level which should essentially be kept uniform.

According to an embodiment of the invention, there is provided a solid-state imaging device including a pixel array section having an effective pixel region formed by a plurality of pixels which are disposed in the form of a matrix, each of which includes a photoelectric conversion device and a transistor reading out an electric charge obtained by photoelectric conversion at the photoelectric conversion device, and which are illuminated by light and a light-shielded pixel region formed by a plurality of pixels which are shielded from light, a row scan section selecting and controlling each row of pixels of the pixel array section to output a signal from each of the pixels of the selected row of pixels to a column signal line provided in association with the row of pixels, and an A-D conversion section converting the signal output from the signal line into a digital signal. The light-shielded pixel region includes an optical black pixel region formed by pixels generating a signal serving as a reference for a black level and a dummy pixel region which is formed by pixels whose signal output path to the column signal line is interrupted to discharge an electric charge generated at the photoelectric conversion device to a power supply and which is provided between the optical black pixel region and the effective pixel region. Each of the effective pixel region, the optical black pixel region, and the dummy pixel region is formed by a group of pixels including a plurality of pixels arranged in a column direction and sharing the floating diffusion portion. The row scan section does not select the dummy pixel region of the light-shielded pixel region.

Another embodiment of the invention is directed to the solid-state imaging device of the above embodiment, wherein, the row scan section includes a plurality of control circuits outputting a control signal for collectively selecting and controlling a group of pixel belonging to a common row. The control circuits may perform a series of selecting and controlling operations to read data starting with the optical black pixel region up to the effective pixel region such that only the optical black pixel region and the effective pixel region are continuously read with the dummy pixel region left unread.

According to still another embodiment of the invention, there is provided an imaging apparatus including a solid-state imaging device. The solid-state imaging device includes a pixel array section having an effective pixel region formed by a plurality of pixels which are disposed in the form of a matrix, each of which includes a photoelectric conversion device and a transistor reading out an electric charge obtained by photoelectric conversion at the photoelectric conversion device, and which are illuminated by light and a light-shielded pixel region formed by a plurality of pixels which are shielded from light, a row scan section selecting and controlling each row of pixels of the pixel array section to output a signal from each of the pixels of the selected row of pixels to a column signal line provided in association with the row of pixels, and an A-D conversion section converting the signal output from the signal line into a digital signal. The light-shielded pixel region includes an optical black pixel region formed by pixels generating a signal serving as a reference for a black level and a dummy pixel region which is formed by pixels whose signal Output path to the column signal line is interrupted to discharge an electric charge generated at the photoelectric conversion device to a power supply and which is provided between the optical black pixel region and the effective pixel region. Each of the effective pixel region, the optical black pixel region, and the dummy pixel region is formed by a group of pixels including a plurality of pixels arranged in a column direction and sharing the floating diffusion portion. The row scan section does not select the dummy pixel region of the light-shielded pixel region.

The embodiments of the invention makes it possible to provide a solid-state imaging device and an imaging apparatus in which electric charges can be prevented from flowing from an optical black pixel region into an effective pixel region by a dummy pixel region disposed between the regions and in which image disturbances attributable to power supply fluctuations and non-uniformity of circuit configuration can be also prevented.

BRIEF DESCRIPTION OF THE DRAWINGS

FIG. 7 is a diagram showing a configuration in which a pixel group is shared between a dummy pixel region and an effective pixel region;

FIG. 8A is a table for explaining characteristics obtained when row scanning is performed on the pixel group shown in FIG. 5;

DESCRIPTION OF THE PREFERRED EMBODIMENTS

Hereinafter, embodiments of the invention will now be described. The description is made in the order listed below.
1. Configuration of Imaging Apparatus
2. Configuration of Solid-State Imaging device
[1. Configuration of Imaging Apparatus]

A configuration of an imaging apparatus according to an embodiment of the invention will now be described with reference to the drawings.

Figure 1:
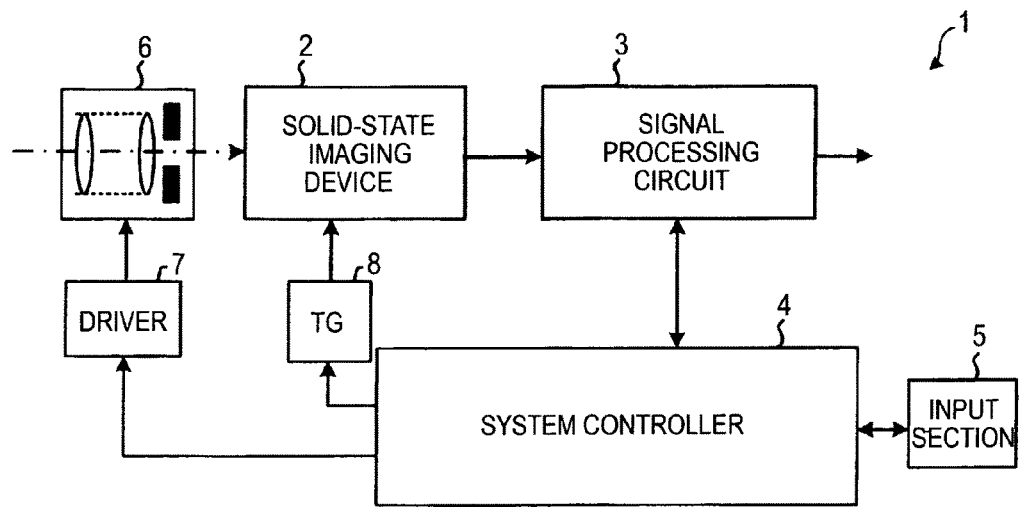
FIG. 1 is a diagram showing a general configuration of an imaging apparatus according to an embodiment of the invention.

As shown in FIG. 1, an imaging apparatus 1 includes a solid-state imaging device 2, a signal processing circuit 3, a system controller 4, an input section 5, and an optical block 6. The imaging apparatus 1 also includes a driver 7 for driving mechanisms in the optical block 6 and a timing generator (TG) for driving the solid-state imaging device 2. The solid-state imaging device 2 is a CMOS type solid-state imaging device.

The optical block 6 includes a lens for converging light from an object on the solid-state imaging device 2, a driving mechanism for moving the lens for focusing or zooming, a mechanical shutter, and a stop. The driver 7 controls the mechanisms in the optical block 6 to drive them according to control signals from the system controller 4.

The solid-state imaging device 2 is driven based on timing signals output from the timing generator 8 to convert the light from the object into electrical signals. The timing generator 8 outputs the timing signals under control exercised by the system controller 4.

The signal processing circuit 3 performs various types of camera signal processing such as automatic focusing and exposure of digital signals from the solid-state imaging device 2, processes for detecting and correcting defective pixels, white balance adjustment, and a matrix process.

For example, the system controller 4 is formed by a CPU (central processing unit), a ROM (read only memory), and a RAM (random access memory). The CPU executes programs stored in the ROM to exercise overall control of various parts of the imaging apparatus 1, and the CPU also performs various calculations required for such control. The input section 5 includes operation keys, dials, and levers for accepting operation inputs from a user and outputs control signals according to the operation inputs to the system controller 4.

Image data output from the signal processing circuit 3 are supplied to a graphic interface circuit which is not shown and converted by the circuit into image signals to be displayed.

Thus, a camera-through image is displayed on a monitor which is not shown. When the system controller 4 is instructed to record an image through an operation input from the user received at the input section 5, the image data of interest is supplied from the signal processing circuit 3 to a CODEC (enCOder/DECoder) to receive a compression coding process, and the resultant image is recorded in a recording medium. When a still image is to be recorded, one frame of image data is supplied from the signal processing circuit 3 to the CODEC. When a motion picture is to be recorded, processed image data are continuously supplied to the CODEC.

[2. Configuration of Solid-State Imaging device 2]

A configuration of a CMOS type solid-state imaging device 2 according to the embodiment of the invention will now be described with reference to the drawings.

Figure 2:
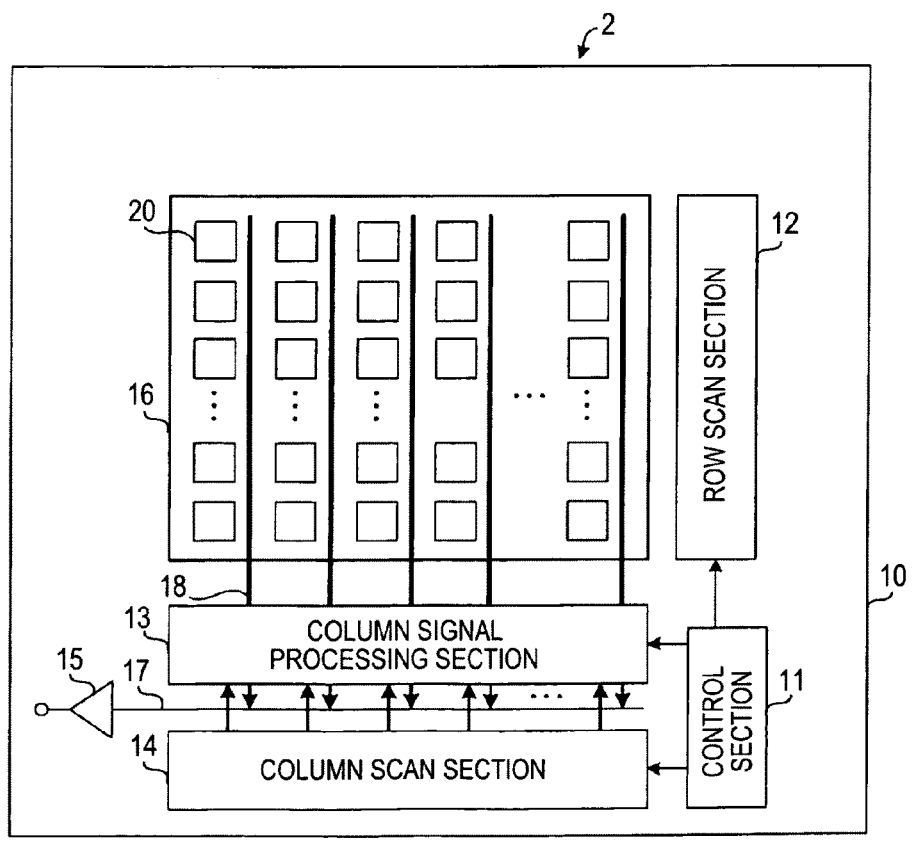
FIG. 2 is a diagram showing a general configuration of a solid-state imaging device according to the embodiment of the invention.

As shown in FIG. 2, the solid-state imaging device 2 according to the present embodiment is provided by forming a control section 11, a row scan section 12, a column signal processing section 13, a column scan section 14, an output section 15, and a pixel array section 16 on a semiconductor substrate 10. For example, the semiconductor substrate 10 is a silicon substrate.

The control section 11 generates clock signals and control signals to serve as references for operations of the row scan section 12, the column signal processing section 13, and the column scan section 14 based on a synchronization signal and a master clock input from the timing generator 8. The control section 11 inputs the control signals generated as thus described to the row scan section 12, the column signal processing section 13, and the column scan section 14.

The row scan section 12 is also referred to as "vertical transfer section", and the section outputs control signals for controlling the pixel array section 16. For example, the row scan section 12 outputs a row selection signal φSEL and a row transfer signal φTG to select and scan rows of pixels 20 of the pixel array section 16 sequentially such that the rows are scanned one after another in the direction in which columns of pixels extend (vertical direction). Thus, a signal (pixel signal) based on a signal charge generated according to the amount of light received at each pixel 20 is supplied to the column signal processing section 13 through a column signal line VSL. The row scan section 12 also supplies a row reset signal φRST to reset the pixels 20.

The column signal processing section 13 converts a signal output to the column signal line VSL from each pixel 20 in columns of pixels of the pixel array section 16 into a digital signal. The column signal processing section 13 generates image data by converting signals output from pixels 20 in an affective pixel region 30, which will be described later, into digital signals using a signal level output from pixels 20 in an optical black pixel region 32, which will be described later, as a reference level.

The column scan section 14 is formed by, for example, a shift register, and the section sequentially outputs column scan pulses to the column signal processing section 13 to cause the column signal processing section 13 to output signals according to the image data. The column scan section 14 is also referred to as "horizontal transfer section". The output section 15 performs predetermined signal processing on signals sequentially supplied from the column signal processing section 13 through a horizontal signal line 17 and outputs resultant signals.

The pixel array section 16 is an array of pixels 20 in the form of a matrix, each pixel including a photoelectric conversion device PD and a transfer transistor (which will be detailed layer) for reading out an electrical charge obtained by photoelectric conversion at the photoelectric conversion device PD and supplying it to a floating diffusion (hereinafter abbreviated as "FD") portion.

Figure 3:
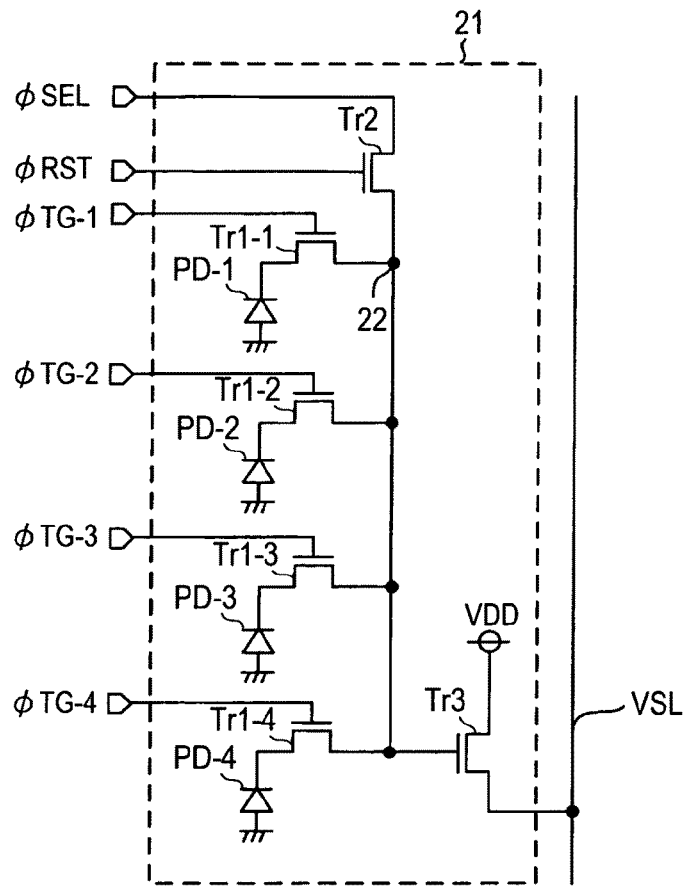
FIG. 3 is a diagram showing a configuration of pixels of the solid state imaging device shown in FIG. 1.

As shown in FIG. 3, the pixel array section 16 according to the present embodiment is a pixel shared type array in which four pixels 20 arranged in the extending direction of columns of pixels share a floating diffusion. The four pixels constitute one pixel group 21. Specifically, four pixels forming a 1 (row)×4 (columns) array share a floating diffusion 22, a reset transistor Tr2, and an amplification transistor Tr3. The number of pixels 20 to share a floating diffusion 22 is not limited to the number shown in the present embodiment. For example, the pixel group 21 may be a 2 (rows)×2 (columns) array or a 2 (rows)×4 (columns) array.

As shown in FIG. 3, the pixel group 21 is formed by photoelectric conversion devices PD-1 to PD-4, transfer transistors Tr1-1 to Tr1-4, the floating diffusion 22, the reset transistor Tr2, and the amplification transistor Tr3.

The photoelectric conversion devices PD-1 to PD-4 are arranged in the extending direction of columns of pixels, and the elements photo-electrically convert incident light into an amount of electrical charge in accordance with the amount of the incident light. For example, the photoelectric conversion devices PD-1 to PD-4 are photodiodes.

The transfer transistors Tr1-1 to Tr1-4 are connected between the photoelectric conversion devices PD-1 to PD-4 and the floating diffusion 22. Row transfer signals φTG-1 to φTG-4 in an active state (at a high level) are sequentially supplied from the row scan section 12 to the gates of the transfer transistors Tr1-1 to Tr1-4, whereby the electrical charges obtained by photoelectric conversion at the photoelectric conversion devices PD-1 to PD-4 are transferred to the floating diffusion 22.

The reset transistor Tr2 is connected between the row selection signal φSEL and the floating diffusion 22. When the row reset signal φRST in the active state (or at the high level) is supplied from the row scan section 12 to the gate of the reset transistor Tr2, the electric potential at the floating diffusion 22 is reset to the electric potential of the row selection signal φSEL if the row selection signal φSEL is active (or at the high level). Thus, electrical charges which have been accumulated at the floating diffusion 22 are swept out. Even when the row reset signal φRST in the active state is supplied from the row scan section 12 to the gate of the reset transistor Tr2, the electric potential at the floating diffusion 22 is not reset to the electric potential of the row selection signal φSEL if the row selection signal φSEL is inactive (or at the low level). The gate of the amplification transistor Tr3 is connected to the floating diffusion 22. The amplification transistor Tr3 amplifies the electric potential at the floating diffusion 22 and outputs a voltage in accordance with the electric potential to the column signal line VSL.

Figure 4:
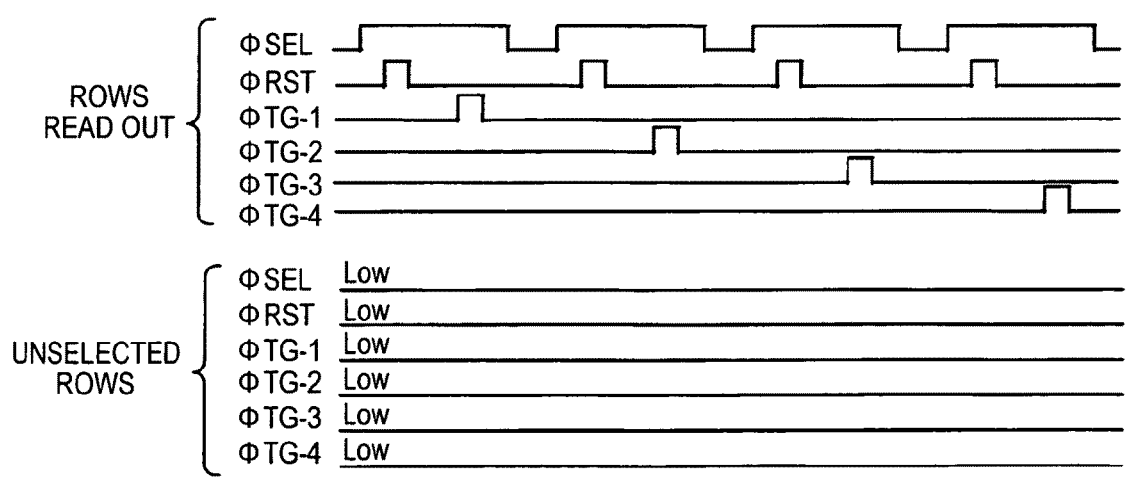
FIG. 4 is a graph for explaining a method of controlling the pixel group shown in FIG. 3.

Steps taken to read out signals from the pixels 20 of a pixel group 21 onto a column signal line VSL will now be specifically described with reference to FIG. 4.

The row scan section 12 activates the row selection signal φSEL associated with a pixel group 21 including rows of pixels from which signals are to be read out (hereinafter referred to as "rows to be read out". Thereafter, the row scan section 12 activates the row reset signal φRST associated with the pixel group 21 including the rows to be read out for a predetermined period. As a result, at the pixels 20 in the rows to be read out, the reset transistor Tr2 turns on to reset the electric potential at the floating diffusion 22 to the electric potential of the row selection signal φSEL, whereby a signal charge which has been accumulated at the floating diffusion 22 is swept out.

Next, the row scan section 12 activates row transfer signals φTG associated with the pixel group 21 including the rows to be read out for a predetermined period to read out signal charges obtained by the photoelectric conversion devices PD into the floating diffusion 22. As a result, at the pixel 20 in a row to be read out, the transfer transistor Tr1 turns on to transfer the signal charge accumulated at the photoelectric conversion device PD to the floating diffusion 22. The transferred signal charge is converted into a voltage signal at the floating diffusion 22 and output to the gate of the amplification transistor Tr3. The voltage signal output from the floating diffusion 22 is amplified by the amplification transistor Tr3 and output to the column signal line VSL. Thereafter, the row scan section 12 renders the row selection signal φSEL inactive to terminate signal readout from one row of pixels.

The above-described operation is repeated. Specifically, as shown in FIG. 4, the transfer transistors Tr1-1 to Tr1-4 are sequentially activated to output voltages in accordance with signal charges at the photoelectric conversion devices PD-1 to PD-4 through the amplification transistor Tr3. The row scan section 12 sequentially reads the rows to be read out from the first row up to the last row and outputs signals for forming an image of an object from the pixel array section 16.

Figure 5:
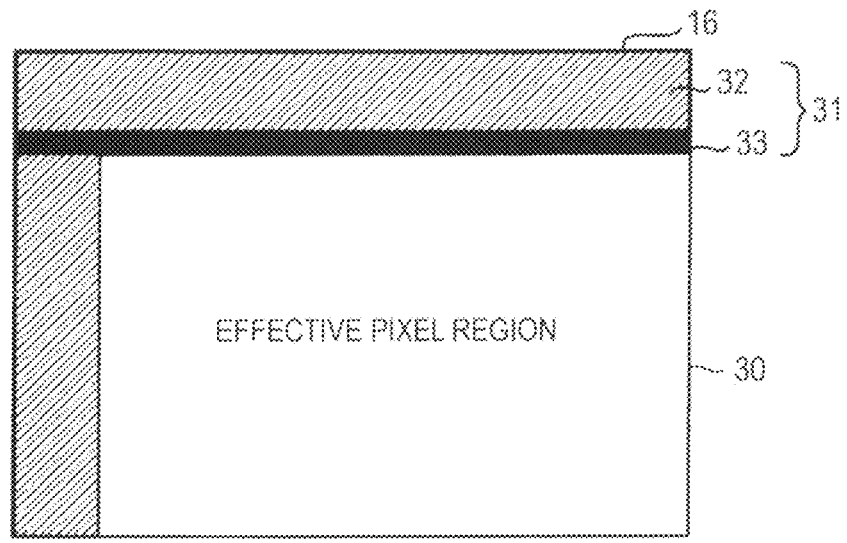
FIG. 5 is an illustration showing a layout of a pixel array section of the solid-state imaging device shown in FIG. 2.

As shown in FIG. 5, the pixel array section 16 has three divisions, i.e., an effective pixel region 30, an optical black pixel region 32, and a dummy pixel region 33.

The effective pixel region 30 is a pixel region formed by a plurality of pixels 20 whose photoelectric conversion devices PD are illuminated by light because no light shield is provided above the photoelectric conversion devices PD.

A light-shielded pixel region 31 is a pixel region formed by a plurality of pixels 20 whose photoelectric conversion devices PD are not illuminated by light because a light shield is provided above the photoelectric conversion devices PD.

The light-shielded pixel region 31 includes the optical black pixel region 32. The optical black pixel region 32 is a pixel region formed by pixels 20 at which a signal to serve as a reference for a black level is generated (optical black pixels).

Further, the light-shielded pixel region 31 includes the dummy pixel region 33 which is provided between the effective pixel region 30 and the optical black pixel region 32. The dummy pixel region 33 is constituted by pixel groups 21 each including pixels 20 whose paths for outputting signals to the column signal lines VSL are interrupted to discharge electrical charges generated at photoelectric conversion devices PD thereof to a power supply.

In the solid-state imaging device 2 according to the present embodiment, the dummy pixel region 33 is formed by pixel groups 21 each of which shares a floating diffusion 22. Further, the readout by the row scan section 12 is not carried out in the dummy pixel region 33.

The dummy pixel region 33 is formed by pixel groups 21 as thus described. That is, the region shares no pixel group with the effective pixel region 30 and the optical black pixel region 32. Therefore, no variation occurs between total capacities of floating diffusion nodes of rows of pixels in the effective pixel region 30 and the optical black pixel region 32, and it is therefore possible to prevent generation of any black level output difference between those regions.

Figure 6:
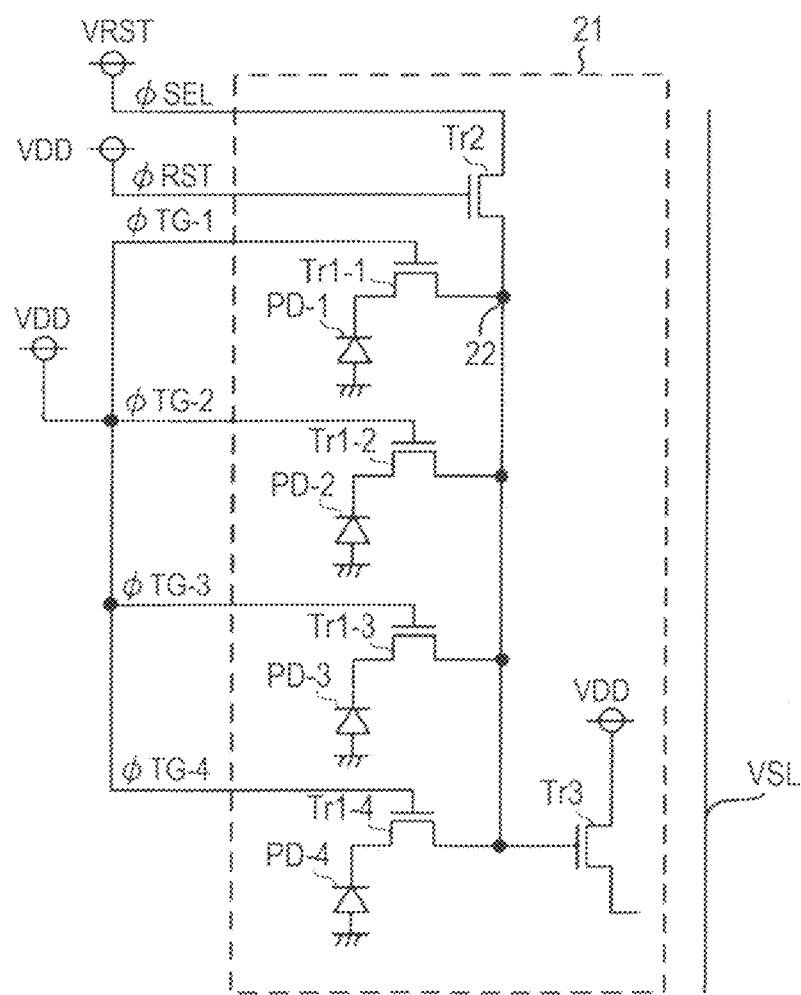
FIG. 6 is a diagram showing a configuration of a pixel group provided in the dummy pixel region shown in FIG. 5.

The dummy pixel region 33 will now be specifically described. FIG. 6 shows a pixel group 21 forming a part of the dummy pixel region 33.

The pixel group 21 forming a part of the dummy pixel region 33 is similar in configuration to pixel groups 21 in the effective pixel region 30 and the optical black pixel region 32 except that the amplification transistor Tr3 of the same is not connected to a column signal line VSL and that the signal output path of the pixel group to a column signal line VSL is therefore interrupted.

Voltages at the high level are applied to the pixel group 21 forming a part of the dummy pixel region 33 as a row select signal φSEL and row transfer signals φTG-1 to φTG-4 such that electrical charges generated at the respective photoelectric conversion devices PD are discharged to the power supply. Thus, the transfer transistors Tr1-1 to Tr1-4 and the reset transistor Tr2 are turned on, and the electrical charges generated at the photoelectric conversion devices PD are discharged to the power supply VRST.

Since the amplification transistor Tr3 is connected to no column signal line VSL as described above, a signal will not be erroneously output to a column signal line VSL from the amplification transistor Tr3.

As thus described, the dummy pixel region 33 is formed by pixel groups each sharing a floating diffusion 22, and the region shares no pixel group with the effective pixel region 30 and the optical black pixel region 32. As a result, there will be no variation between total capacities of floating diffusion nodes of pixel rows in the optical black pixel region 32, and it is therefore possible to prevent different black levels from being output.

Specifically, when one pixel group is shared between an optical black pixel region and a dummy pixel region as shown in FIG. 7, only two transfer transistors are connected to the floating diffusion in the optical black pixel region. On the contrary, four transfer transistors are connected to the floating diffusion in the effective pixel region. Therefore, the total capacities of the floating diffusion nodes in the optical black pixel region and the effective pixel region are different from each other, and different black levels will therefore be output in those regions.

Let us assume that a pixel group is shared between an effective pixel region and a dummy pixel region in a Bayer array having a RGB pixel ratio of R:G:B=1:2:1. Then, signals of the same color are summed between pixel groups which are different from each other in terms of the total capacity of floating diffusion nodes as shown in FIG. 8A. When outputs are provided from pixel groups which are different from each other in terms of the total capacity of floating diffusion nodes, there is a difference between the output levels depending on the total capacities of floating diffusion nodes of the groups. Thus, the reproduced image will have low quality.

In the solid-state imaging device 2 of the preset embodiment, each pixel unit of the dummy pixel region 33 is constituted by a pixel group 21. Each pixel unit of the optical black pixel region 32 and the effective pixel region 30 is similarly constituted by a pixel group 21. Therefore, those regions are equal to each other in terms of the total capacity of the nodes of a floating diffusion 22 therein.

Figure 8B:
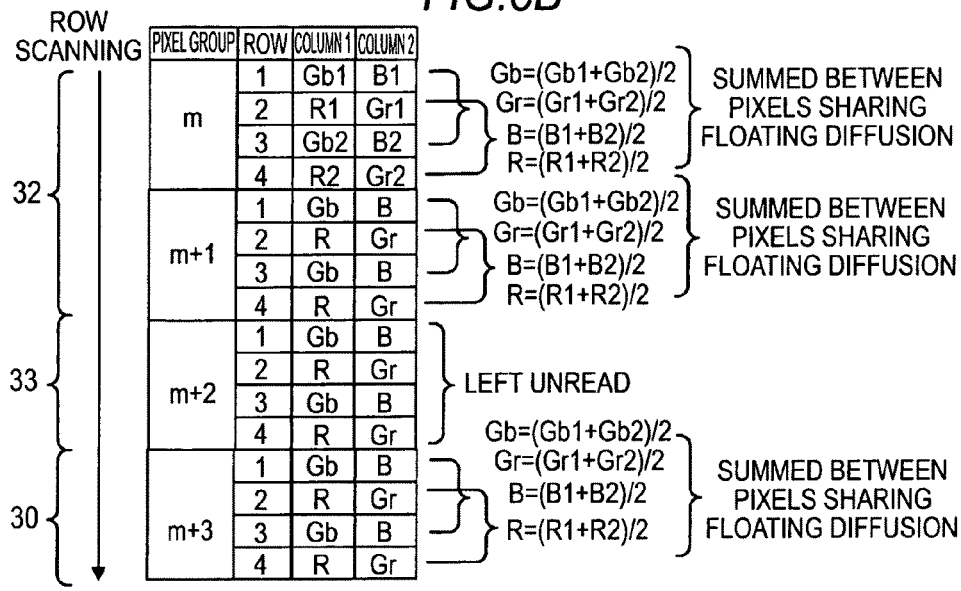
FIG. 8B is a table for explaining characteristics obtained when row scanning is performed on the pixel group shown in FIG. 7.

It is therefore possible to prevent different black levels from being output in the regions. As shown in FIG. 8B, signals of the same color are summed between pixel groups 21 which are equal to each other in terms of the total capacity of the nodes of a floating diffusion 22. Thus, the degradation of the reproduced image can be prevented.

As described above, the rows of pixels in the dummy pixel region 33 of the solid-state imaging device 2 according to the preset embodiment are not read out by the row scan section 12. It is therefore possible to prevent noise from being superimposed on signals output from the effective pixel region 30.

Figure 9A:
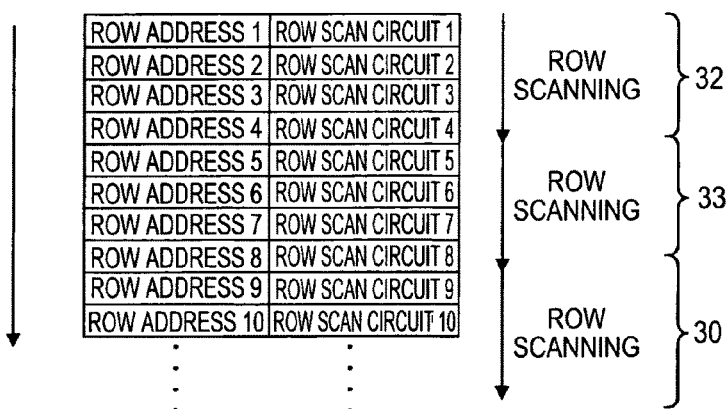
FIG. 9A is an illustration showing a method of row scanning according to the related art.

According to the related art, for example, rows of pixels in the optical black pixel region 32, the dummy pixel region 33, and the effective pixel region 30 are sequentially scanned by respective row scan circuits of the row scan section 12, as shown in FIG. 9A.

Figure 10A:
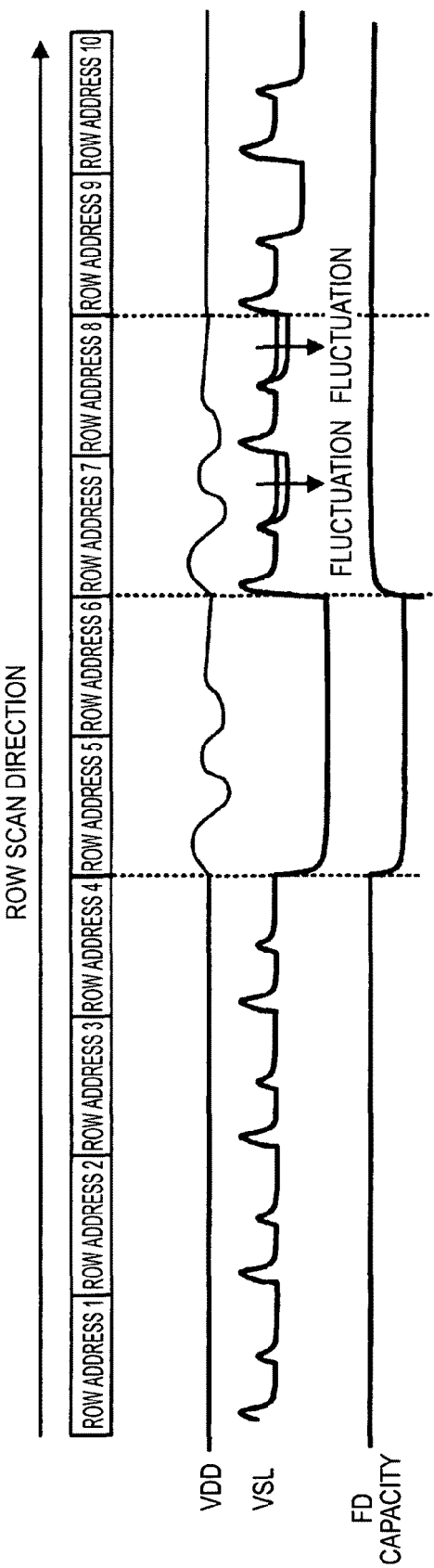
FIG. 10A is a graph for explaining states of power supply observed when a method of row scanning according to the related art is used.

When rows of pixels are scanned as thus described, the driving load on the row scan section 12 driving the pixels 20 abruptly fluctuates as the position of row scanning moves from the optical black pixel region 32 into the dummy pixel region 33. Such abrupt load fluctuations result in fluctuations of the power supply voltage VDD. Fluctuations of the power supply voltage VDD remain after the scanning position moves from the optical black pixel region into the effective pixel region as shown in FIG. 10A. Therefore, signals output from the pixels 20 to the column signal lines VSL are adversely affected.

Figure 9B:
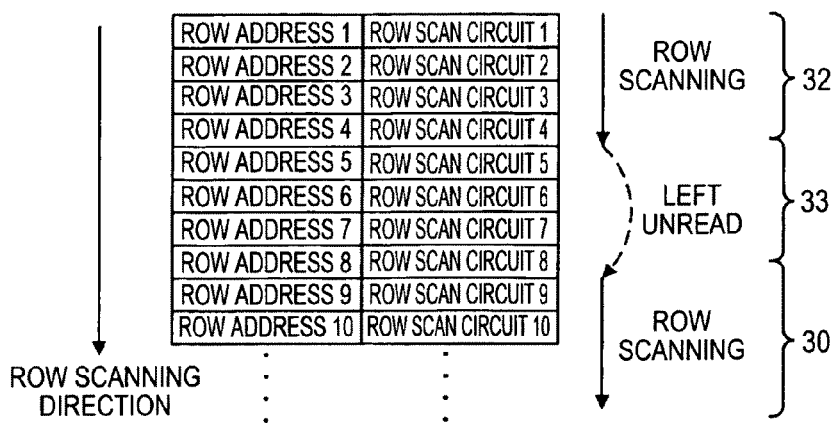
FIG. 9B is an illustration showing a method of row scanning performed in the solid-state imaging device shown in FIG. 1.

In the solid-state imaging device 2 according to the present embodiment, as shown in FIG. 9B, after scanning the rows of pixels in the optical black pixel region 32, the row scan section 12 continues scanning rows of pixels in the effective pixel region 30 instead of moving from the optical black pixel region 32 into the dummy pixel region 33. That is, the row scan section 12 does not scan the rows of pixels in the dummy pixel region 33 or leaves the region unread.

Figure 10B:
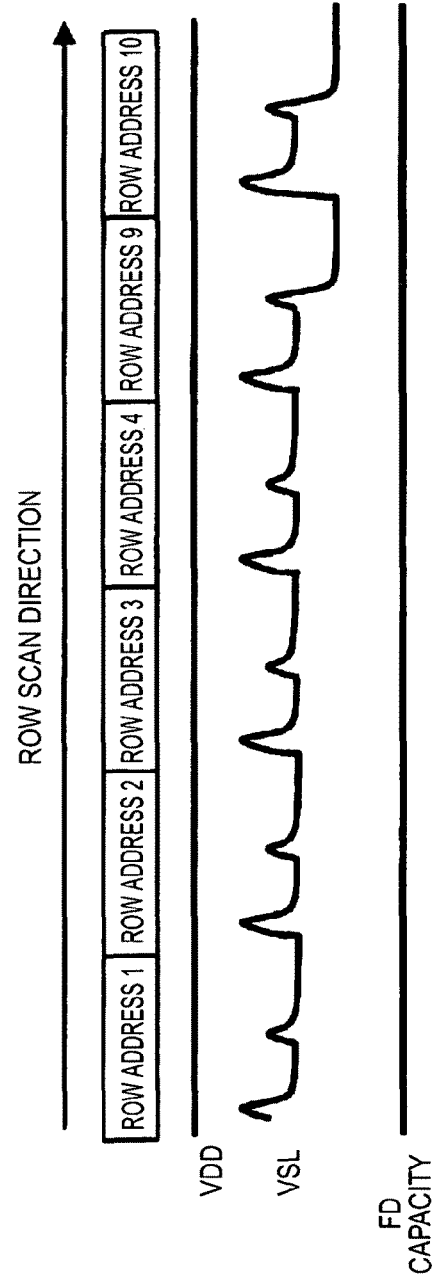
FIG. 10B is a graph showing states of power supply observed when the row scanning method of the solid-state imaging device shown in FIG. 1 is used.

When rows of pixels are scanned as thus described, the driving load placed on the row scan section 12 driving pixel 20 is prevented from fluctuating as shown in FIG. 10B. It is therefore possible to suppress adverse effects on the power supply voltage VDD and to suppress degradation of the quality of the reproduced image consequently.

A configuration of the row scan section 12 will now be described with reference to FIG. 11.

Figure 11:
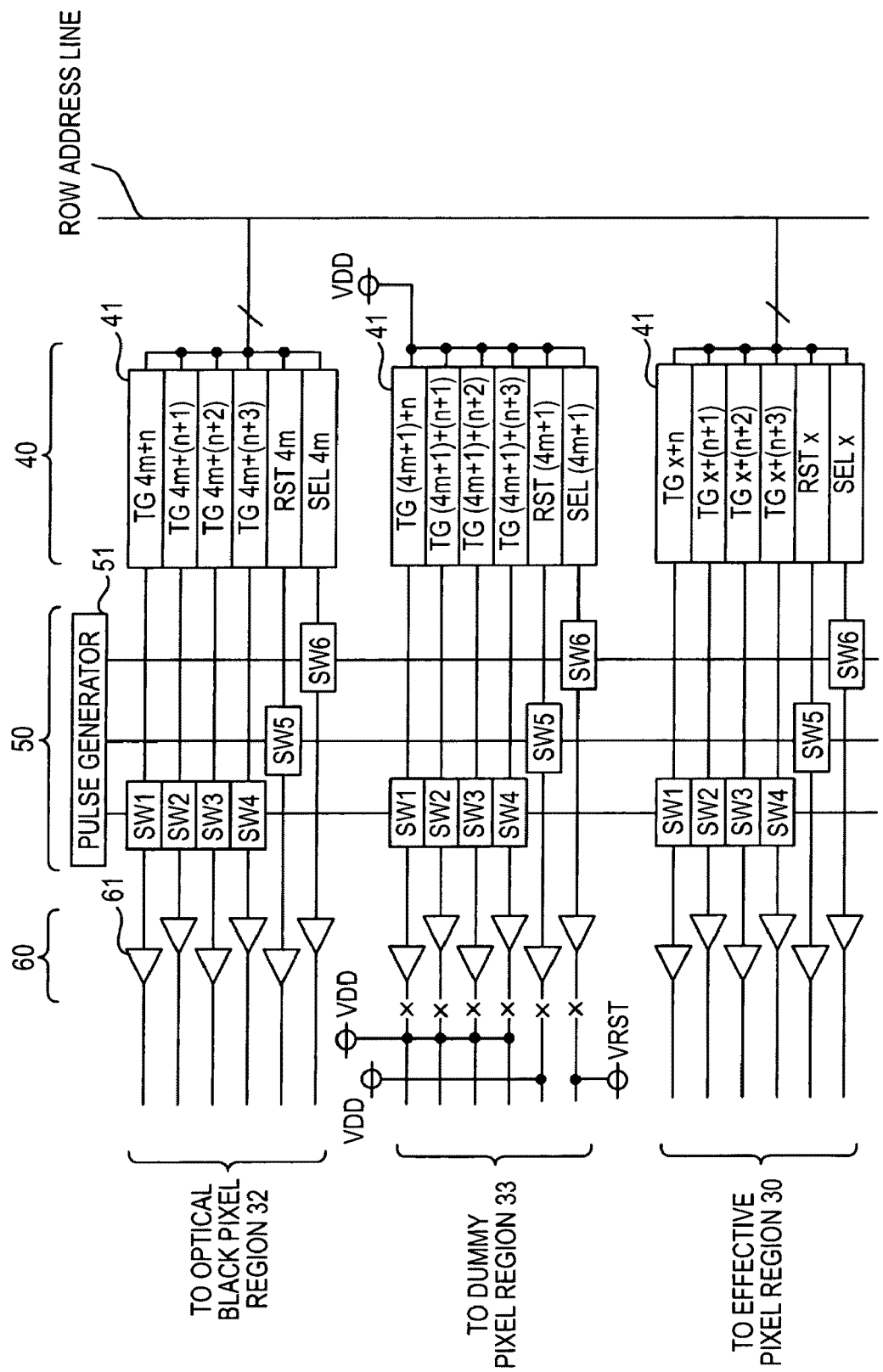
FIG. 11 is a diagram showing a configuration of the row scan section shown in FIG. 2.

As shown in FIG. 11, the row scan section 12 includes an address decoder portion 40, a timing pulse generating portion 50, and a driver portion 60. A row scan circuit (control circuit) is formed by such portions in association with each of pixel groups 21 arranged in the column direction for controlling the pixel groups 21 each of which is formed by four pixels. That is, there is provided a plurality of row scan circuits (control circuits) each of which collectively selects and controls pixel groups belonging to a common row.

The address decoder portion 40 includes a plurality of address decoder circuits 41 outputting a signal which becomes active (high level) at timing when an address coinciding with a preset address is input. Such an address decoder circuit is provided for each pixel group 21. The input of an address decoder circuit 41 associated with a pixel group 21 in the dummy pixel region 33 is connected to power supplies supplying the power supply voltages VDD and VRST, and the circuit is configured to always output an inactive (low level) signal. Addresses in the address decoder circuits 41 are set such that row scanning is continued in the effective pixel region 30 after the optical black pixel region 32 is scanned with the dummy pixel region 33 left unread.

The timing pulse generating portion 50 includes a pulse generating part 51 generating a pulse signal having a predetermined pattern for each row to be scanned and switches SW1 to SW6 provided for each pixel group 21. Each address decoder circuit 41 of the address decoder portion 40 outputs signals which become active (high level) at timing when addresses coinciding with preset addresses are input to turn the respective switches SW1 to SW6 connected to the address decoder circuits 41 on. Thus, row transfer signals φTG1 to φTG4, a row selection signal φSEL, and a row reset signal φRST output from the pulse generating part 51 are input to the driver portion 60.

The driver portion 60 includes a plurality of drivers 61, and row transfer signals φTG-1 to φTG-4, row selection signals φSEL, and row reset signals φRST output from the timing pulse generating portion 50 are input to the drivers 61, respectively.

The drivers 61 output the row transfer signals φTG-1 to φTG-4, row selection signals φSEL, and row reset signals φRST to the pixel groups 21 in the effective pixel region 30 and the optical black pixel region 32 after amplifying the signals. The output of the drivers 61 is not connected to the pixel groups 21 in the dummy pixel region 33. The output is connected to the power supplies of the power supply voltages VDD and VRST. Thus, each of the row transfer signals φTG-1 to φTG-4, the row selection signal φSEL, and the row reset signal φRST is at the high level.

As thus described, the row scan section 12 includes identical row scan circuits (each of which is formed by an address decoder circuit 41, switches SW1 to SW6, and drivers 61) provided in association with each of the effective pixel region 30, the optical black pixel region 32, and the dummy pixel region 33. Therefore, each row scan circuit of the row scan section 12 can be associated with one pixel unit of the pixel array section 16 formed by a plurality of rows of pixels (four rows of pixels in this case). It is therefore possible to prevent the layout of the pixel units formed by a plurality of rows of pixels (four rows of pixels) from varying between various regions of the pixel array section 16. Since the circuit configuration can be kept uniform as thus described, variation of characteristics between pixel units each formed by a plurality of rows of pixels can be suppressed to reproduce an image with high quality.

In the example shown in FIG. 11, pixel groups 21 consecutively provided in the same row of the dummy pixel region can be collectively put in a non-operating state by interrupting the wirings between the pixel groups 21 and the drivers 61 in the dummy pixel region 33 and connecting the wirings only between the pixel groups 21 and power supplies.

Figure 12:
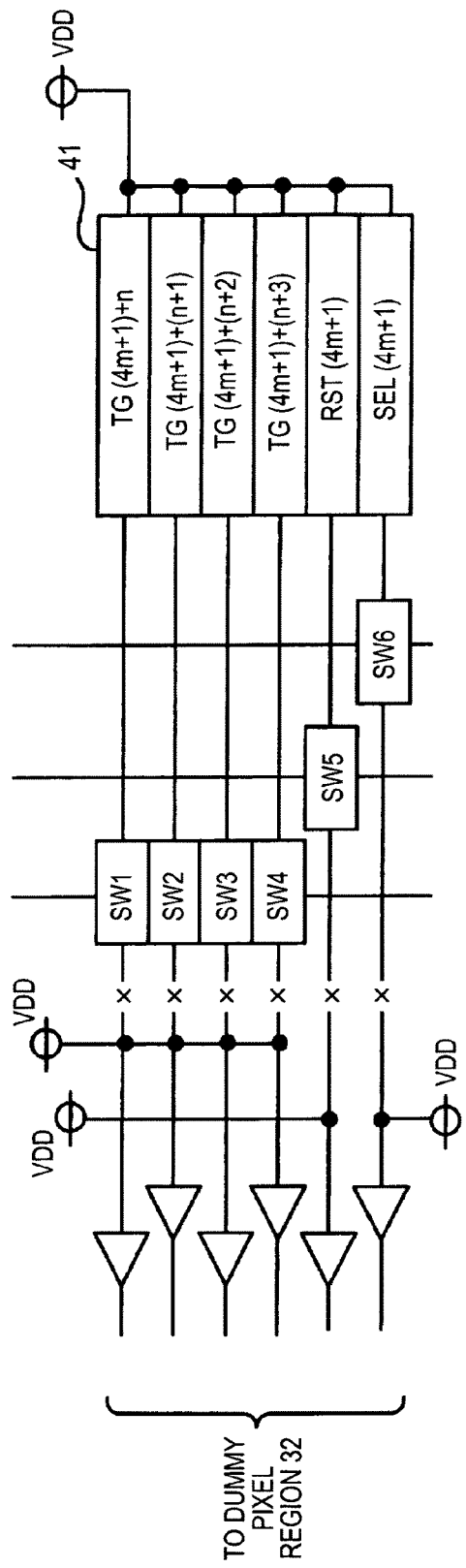
FIG. 12 is a diagram showing a modification of the row scan section shown in FIG. 2.

Alternatively, the wirings between the drivers 61 and the switches SW1 to SW6 may be interrupted, and the wirings may be connected between the driers 61 and the power supplies, as shown in FIG. 12.

Figure 13:
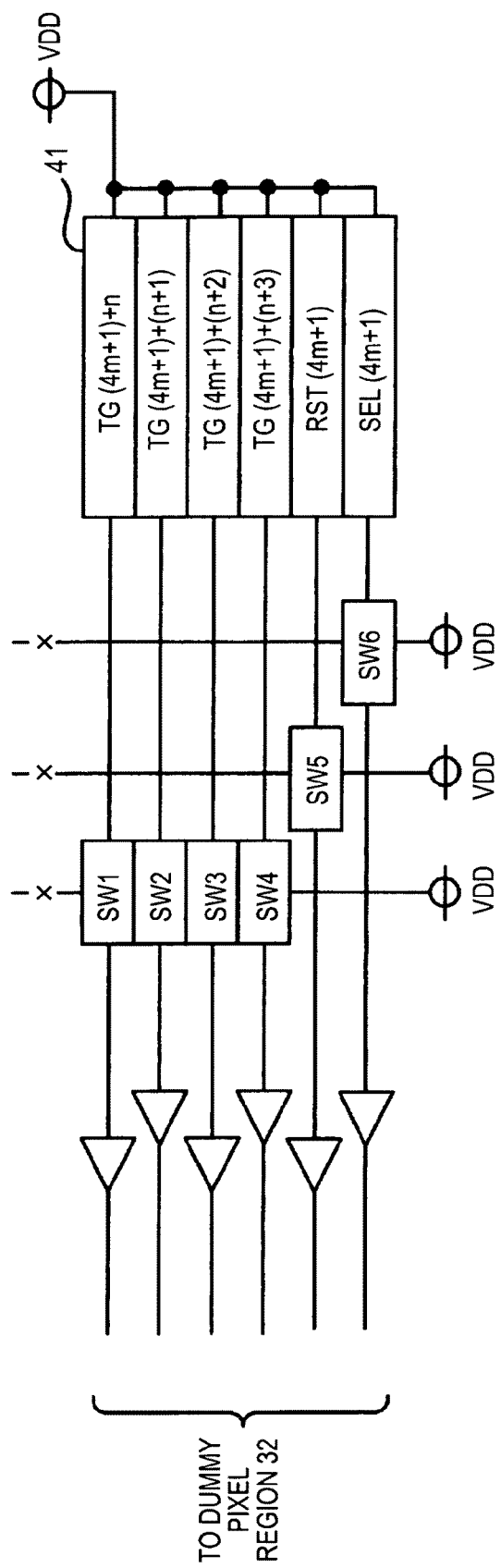
FIG. 13 is a diagram showing another modification of the row scan section shown in FIG. 2.

Another alternative is to interrupt the wirings between the pulse generator 51 and the switches SW1 to SW6 and to connect the wirings between the switches SW1 to SW6 and power supplies, as shown in FIG. 13.

The row scan section 12 has a plurality of row scan circuits each of which outputs a control signal to collectively select and control pixel groups 21 provided in a common row. The row scan section 12 performs a series of selecting and controlling operations to read data starting with the optical black pixel region 32 up to the effective pixel region 30 with the dummy pixel region 33 left unread, and the selection and control is carried out such that only the optical black pixel region 32 and the effective pixel region 30 are continuously read out. Thus, rows of pixels can be scanned with the dummy pixel region 33 skipped, and it is therefore possible to suppress degradation of a reproduced image which can be otherwise caused by fluctuations of the power supplies.

As described above, the dummy pixel region 33 of the solid-state imaging device 2 of the present embodiment is formed by pixel groups 21 each of which share a common floating diffusion 22, and the dummy pixel region 33 is not read by the row scan section 12. Thus, degradation of the image quality of an image thus reproduced can be prevented.

A pixel 20 formed by three MOS transistors, i.e., a transfer transistor Tr1, a reset transistor Tr2, and an amplification transistor Tr3 has been described above by way of example.

Figure 14:
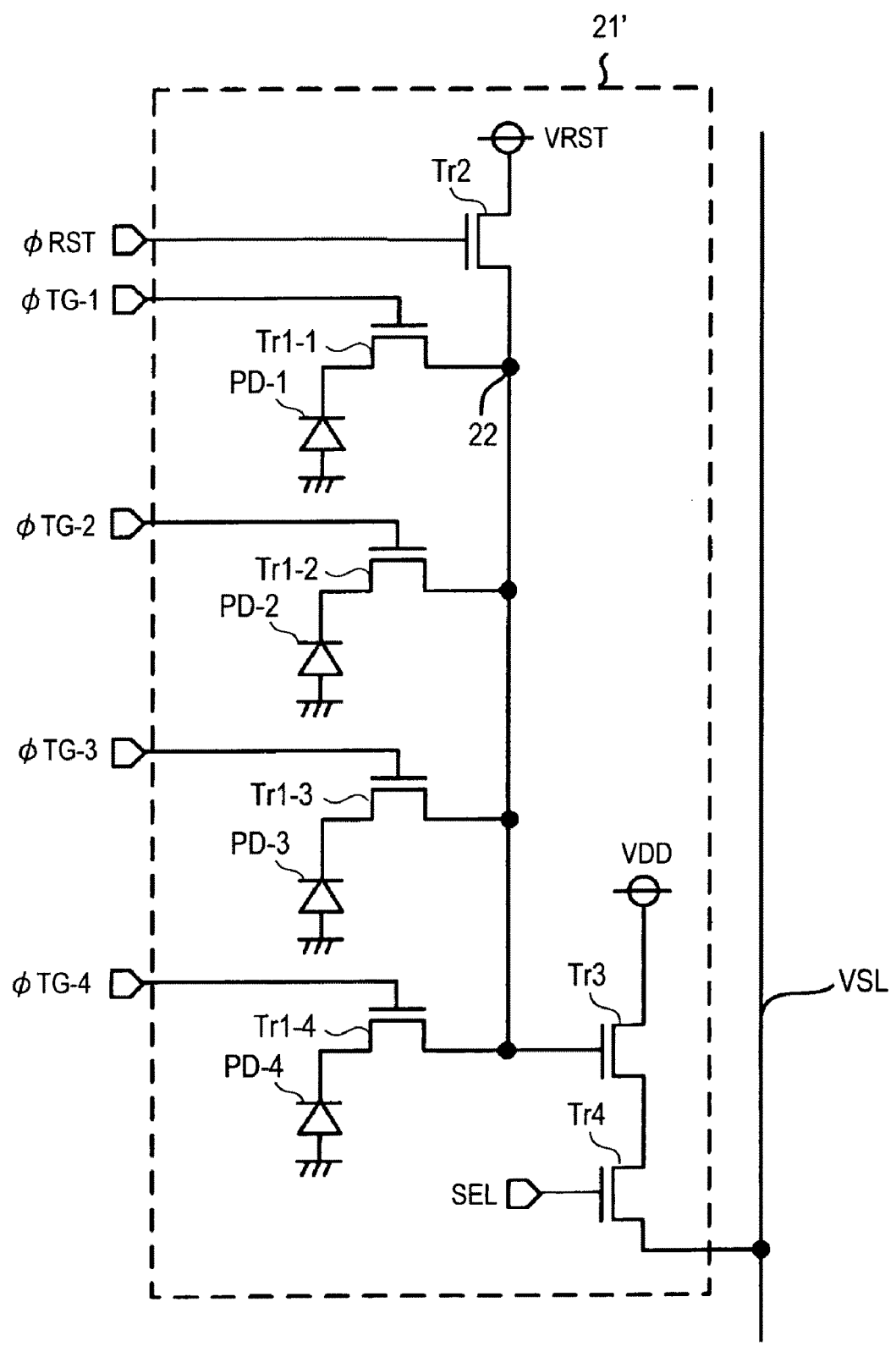
FIG. 14 is a diagram showing another configuration of pixels of a solid-state imaging device.

The invention can be similarly embodied by a pixel 20' formed by four MOS transistors as shown in FIG. 14. Referring to FIG. 14, a selection transistor Tr4 is provided in addition to a transfer transistor Tr1, a reset transistor Tr2, and an amplification transistor Tr3.

Figure 15:
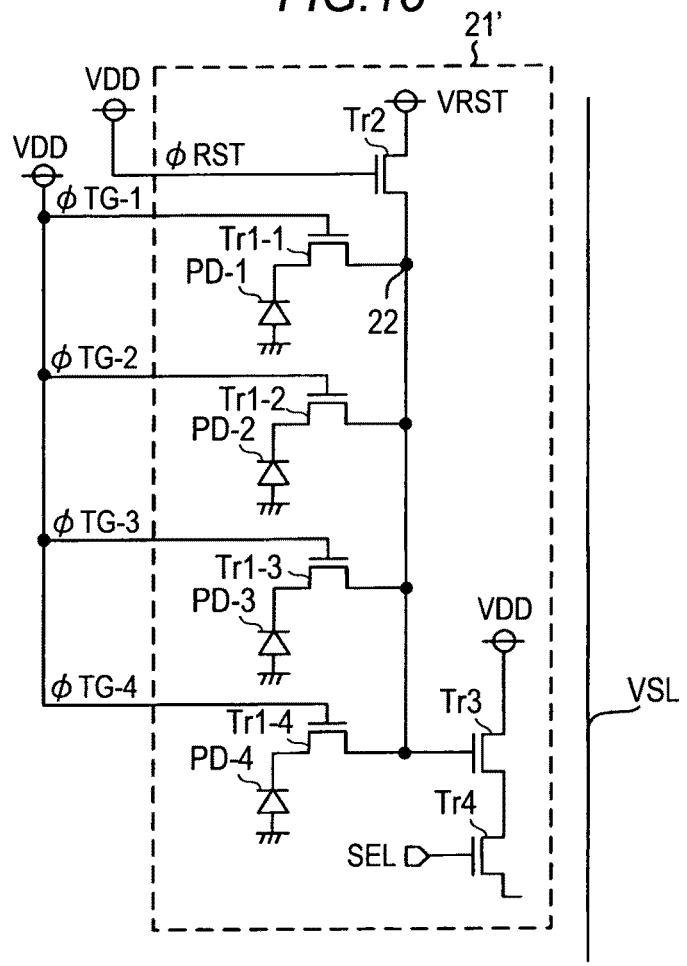
FIG. 15 is a diagram showing a configuration of a pixel group in a dummy pixel region.
Figure 16:
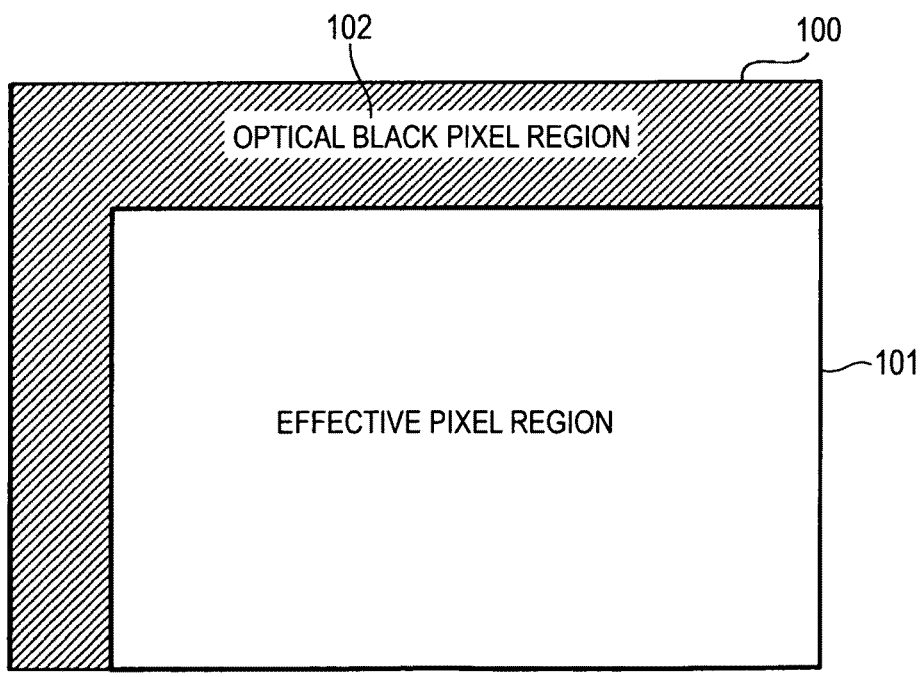
FIG. 16 is an illustration showing a layout of a pixel array section of a solid-state imaging device according to the related art.

The gates of the transistors Tr1-1 to Tr1-4 and Tr2 of a pixel group 21' of the dummy pixel region 33 are connected to a power supply as shown in FIG. 15 to provide row transfer signals φTG-1 to φTG-4 and a reset signal φRST in the form of voltages at a high level. Thus, signal charges at the photoelectric conversion devices PD are swept out into a reset drain region which is not shown. The source of the selection transistor Tr4 is not connected to the column signal line VSL to prevent the signal from the amplification transistor Tr3 from being erroneously output to the column signal line VSL.

Some embodiments of the invention are explained above with reference to the drawings. However, they are represented as examples and the invention can be implemented as another forms with various modifications and improvements based on the knowledge of those skilled in the art.

The present application contains subject matter related to that disclosed in Japanese Priority Patent Application JP 2010-019056 filed in the Japan Patent Office on Jan. 29, 2010, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
   a pixel array section having an effective pixel region formed by a plurality of pixels which are disposed in the form of a matrix, each of which includes a photoelectric conversion device and a transistor reading out an electric charge obtained by photoelectric conversion at the photoelectric conversion device, and which are illuminated by light and a light-shielded pixel region formed by a plurality of pixels which are shielded from light;
   a row scan section selecting and controlling each row of pixels of the pixel array section to output a signal from each of the pixels of the selected row of pixels to a column signal line provided in association with the row of pixels; and
   an A-D conversion section converting the signal output from the signal line into a digital signal, wherein
   the light-shielded pixel region includes an optical black pixel region formed by pixels generating a signal serving as a reference for a black level and a dummy pixel region which is formed by pixels whose signal output path to the column signal line is interrupted to discharge an electrical charge generated at the photoelectric conversion device to a power supply and which is provided between the optical black pixel region and the effective pixel region,
   each of the effective pixel region, the optical black pixel region, and the dummy pixel region is formed by a group of pixels including a plurality of pixels arranged in a column direction and sharing the floating diffusion portion, and
   the row scan section does not select the dummy pixel region of the light-shielded pixel region.

2. A solid-state imaging device according to claim 1, wherein the row scan section includes a plurality of control circuits outputting a control signal for collectively selecting and controlling a group of pixel belonging to a common row, the control circuits performing a series of selecting and controlling operations to read data starting with the optical black pixel region up to the effective pixel region such that only the optical black pixel region and the effective pixel region are continuously read with the dummy pixel region left unread.

3. An imaging apparatus comprising a solid-state imaging device, wherein the solid-state imaging device includes:
   a pixel array section having an effective pixel region formed by a plurality of pixels which are disposed in the form of a matrix, each of which includes a photoelectric conversion device and a transistor reading out an electric charge obtained by photoelectric conversion at the photoelectric conversion device, and which are illuminated by light and a light-shielded pixel region formed by a plurality of pixels which are shielded from light;
   a row scan section selecting and controlling each row of pixels of the pixel array section to output a signal from each of the pixels of the selected row of pixels to a column signal line provided in association with the row of pixels;
   and an A-D conversion section converting the signal output from the signal line into a digital signal and wherein
   the light-shielded pixel region includes an optical black pixel region formed by pixels generating a signal serving as a reference for a black level and a dummy pixel region which is formed by pixels whose signal output path to the column signal line is interrupted to discharge an electrical charge generated at the photoelectric conversion device to a power supply and which is provided between the optical black pixel region and the effective pixel region,
   each of the effective pixel region, the optical black pixel region, and the dummy pixel region is formed by a group of pixels including a plurality of pixels arranged in a column direction and sharing the floating diffusion portion, and
   the row scan section does not select the dummy pixel region of the light-shielded pixel region.

* * * * *